United States Patent
Lerner et al.

(10) Patent No.: US 7,923,660 B2
(45) Date of Patent: Apr. 12, 2011

(54) PULSED LASER ANNEAL SYSTEM ARCHITECTURE

(75) Inventors: Alexander N. Lerner, San Jose, CA (US); Timothy N. Thomas, Portland, OR (US); Sundar Ramamurthy, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 909 days.

(21) Appl. No.: 11/839,436

(22) Filed: Aug. 15, 2007

(65) Prior Publication Data

US 2009/0045182 A1 Feb. 19, 2009

(51) Int. Cl.
- *B23K 9/00* (2006.01)
- *H05B 3/68* (2006.01)
- *H01L 21/20* (2006.01)
- *H01L 21/336* (2006.01)

(52) U.S. Cl. .............. 219/121.85; 219/444.1; 438/308; 438/487

(58) Field of Classification Search .. 219/121.6–121.86, 219/444.1; 438/5, 308, 487, 488, 795; 118/724, 118/725

See application file for complete search history.

(56) References Cited

U.S. PATENT DOCUMENTS

| 5,923,966 A | 7/1999 | Teramota et al. |
| 6,242,291 B1 * | 6/2001 | Kusumoto et al. ............ 438/158 |
| 6,844,523 B2 * | 1/2005 | Yamazaki et al. ....... 219/121.66 |

FOREIGN PATENT DOCUMENTS

| CN | 1320954 | 11/2001 |
| JP | 08-102476 | 4/1996 |

OTHER PUBLICATIONS

First Office Action dated Dec. 11, 2009 for Chinese Patent Application No. 2008102104739.
Notice to File a Response dated Jul. 15, 2010 for Korean Patent Application No. 10-2008-0080115.

* cited by examiner

*Primary Examiner* — Sang Y Paik
(74) *Attorney, Agent, or Firm* — Patterson & Sheridan, LLP

(57) ABSTRACT

Disclosed is the method and apparatus for annealing semiconductor substrates. One embodiment provides a semiconductor processing chamber comprising a first substrate support configured to support a substrate, a second substrate support configured to support a substrate, a shuttle coupled to the first substrate support and configured to move the first substrate support between a processing zone and a first loading zone, wherein the processing zone having a processing volume configured to alternately accommodating the first substrate support and the second substrate support.

23 Claims, 11 Drawing Sheets

PULSED LASER ANNEAL SYSTEM ARCHITECTURE

BACKGROUND OF THE INVENTION

1. Field of the Invention

Embodiments of the present invention generally relate to an apparatus for manufacturing a semiconductor device. More particularly, embodiments of the present invention an apparatus for thermally processing a substrate.

2. Description of the Related Art

During semiconductor processing, substrates may be heated to high temperatures so that various chemical and/or physical reactions can take place. Thermal processes are usually used to heat the substrates. A typical thermal process, such as annealing, requires providing a relatively large amount of thermal energy to the substrate in a short amount of time, and thereafter rapidly cooling the wafer to terminate the thermal process. Examples of thermal processes currently in use include Rapid Thermal Processing (RTP) and impulse (spike) annealing. While such processes are widely used, current technology is not ideal. It tends to ramp the temperature of the wafer too slowly and expose the wafer to elevated temperatures for too long. These problems become more severe with increasing wafer sizes, increasing switching speeds, and/or decreasing feature sizes.

In general, these thermal processes heat the substrates under controlled conditions according to a predetermined thermal recipe. These thermal recipes fundamentally consist of a temperature that the semiconductor substrate must be heated to the rate of change of temperature, i.e., the temperature ramp-up and ramp-down rates and the time that the thermal processing system remains at a particular temperature. For example, thermal recipes may require the substrate to be heated from room temperature to distinct temperatures of 1200° C. or more, for processing times at each distinct temperature ranging up to 60 seconds, or more.

Moreover, to meet certain objectives, such as minimal inter-diffusion of materials between different regions of a semiconductor substrate, the amount of time that each semiconductor substrate is subjected to high temperatures must be restricted. To accomplish this, the temperature ramp rates, both up and down, are preferably high. In other words, it is desirable to be able to adjust the temperature of the substrate from a low to a high temperature, or visa versa, in as short a time as possible.

The requirement for high temperature ramp rates led to the development of Rapid Thermal Processing (RTP), where typical temperature ramp-up rates range from 200 to 400° C./s, as compared to 5-15° C./minute for conventional furnaces. Typical ramp-down rates are in the range of 80-150° C./s. A drawback of RTP is that it heats the entire wafer even though the IC devices reside only in the top few microns of the silicon wafer. This limits how fast one can heat up and cool down the wafer. Moreover, once the entire wafer is at an elevated temperature, heat can only dissipate into the surrounding space or structures. As a result, today's state of the art RTP systems struggle to achieve a 400° C./s ramp-up rate and a 150° C./s ramp-down rate.

To resolve some of the problems raised in conventional RTP type processes various scanning laser anneal techniques have been used to anneal the surface(s) of the substrate. In general, these techniques deliver a constant energy flux to a small region on the surface of the substrate while the substrate is translated, or scanned, relative to the energy delivered to the small region. Due to the stringent uniformity requirements and the complexity of minimizing the overlap of scanned regions across the substrate surface these types of processes are not effective for thermal processing contact level devices formed on the surface of the substrate.

Pulsed laser anneal techniques, generally project a pulsed electromagnetic energy at one small region on the substrate, and then move the substrate relative to the energy source and expose other small region to a pulsed electromagnetic energy. The pulsed laser anneal techniques minimizes overlap between processing regions on the substrate, therefore improving thermal annealing uniformity. However, the energy sources used in the pulsed laser anneal techniques must be able to deliver a relative large amount of energy at a relatively short time period, therefore, are expensive.

In view of the above, there is a need for an apparatus for annealing a semiconductor substrate with increased uniformity and reduced cost for ownership.

SUMMARY OF THE INVENTION

Embodiments of the present invention generally provide methods and apparatus for processing semiconductor substrates. Particularly, embodiments of the present invention provide method and apparatus for annealing semiconductor substrates.

One embodiment of the present invention provides a semiconductor processing chamber comprising a first substrate support configured to support a substrate, a second substrate support configured to support a substrate, a shuttle coupled to the first substrate support and configured to move the first substrate support between a processing zone and a first loading zone, wherein the processing zone having a processing volume configured to alternately accommodating the first substrate support and the second substrate support.

Another embodiment of the present invention provides an annealing system, comprising a processing chamber having a processing zone, a first loading zone and a second loading zone, a first substrate support assembly configured to support and transfer a substrate between the first loading zone and the processing zone, a second substrate assembly configured to support and transfer a substrate between the second loading zone and the processing zone, a shuttle configured to alternately position the first and second substrate assemblies in the processing zone, and an energy source configured to project an energy to an anneal region in the processing zone.

Yet another embodiment of the present invention provides a method for processing semiconductor substrates comprising loading a first substrate on a first substrate support assembly positioned in a first loading zone, preheating the first substrate in the first loading zone, moving the first substrate support assembly to a processing zone to position the first substrate in the processing zone, aligning a first region of the first substrate with an annealing region of an energy source disposed in the processing zone, and projecting a pulsed energy to the first region of the first substrate using the energy source.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention generally provides apparatus and method for performing a pulsed annealing process. In one embodiment, an anneal processing system comprises two substrate support assemblies and one energy source. The two support assemblies are used alternately to position and prepare substrates for annealing process and improve the system throughput.

Figure 1:
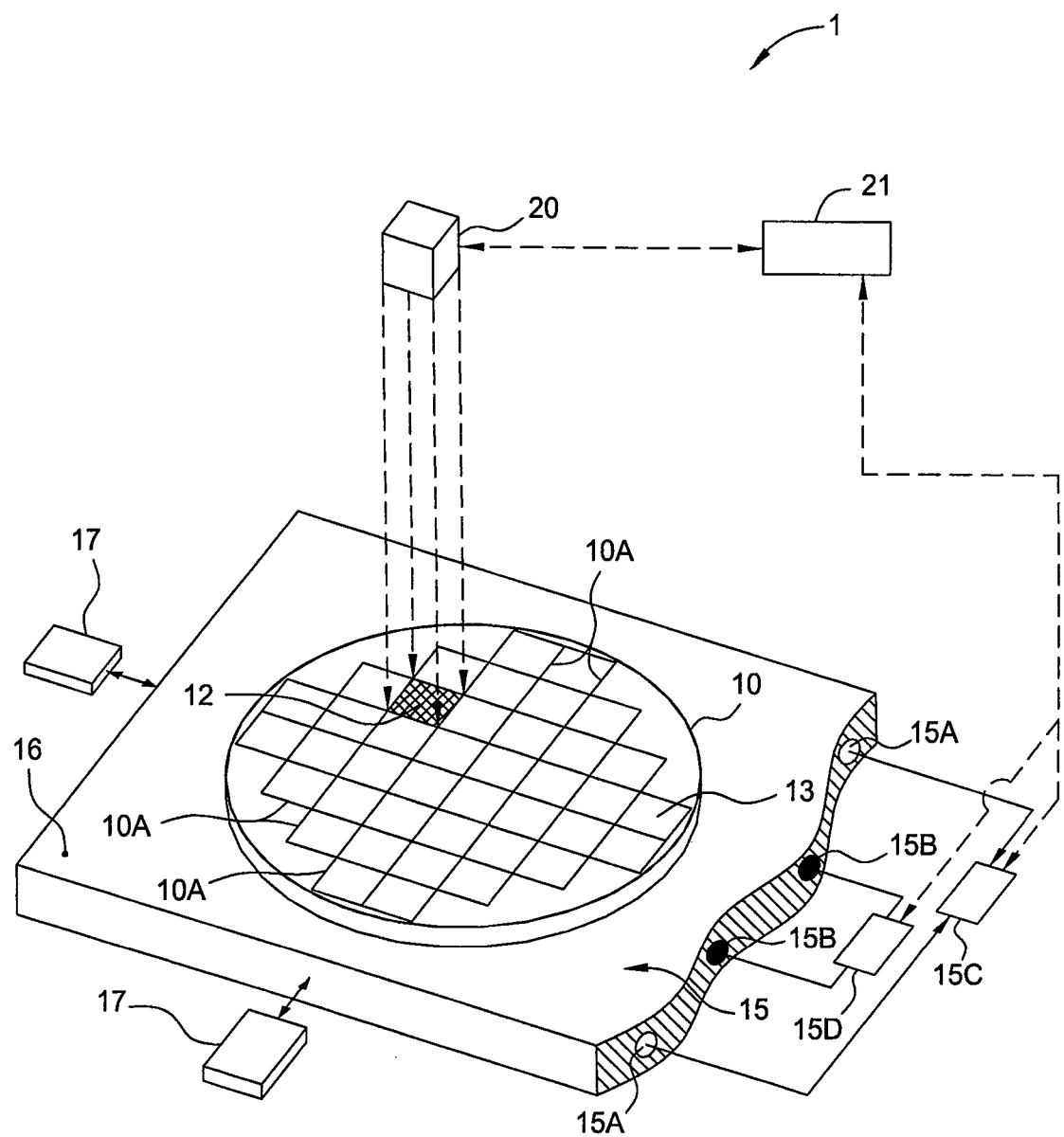
FIG. 1 schematically illustrates an isometric view of pulsed laser annealing process in accordance with one embodiment of the present invention.

FIG. 1 schematically illustrates an anneal system 1 in accordance with one embodiment of the present invention. The anneal system 1 comprises an energy source 20 which is adapted to project an amount of energy on a defined region, or an anneal region 12, of a substrate 10 to preferentially melt certain desired regions within the anneal region 12.

In one example, as shown in FIG. 1, only one defined region of the substrate 10, such as an anneal region 12, is exposed to the radiation from the energy source 20 at any given time. The substrate 10 moves relatively to the energy source 20 so that other regions on the substrate 10 may be sequentially exposed to the energy source 20.

In one aspect of the invention, multiple areas of the substrate 10 are sequentially exposed to a desired amount of energy delivered from the energy source 20 to cause the preferential melting of desired regions of the substrate 10.

In general, the areas on the surface of the substrate 10 may be sequentially exposed by translating the substrate 10 relative to the output of the energy source 20 (e.g., using conventional X/Y stages, precision stages) and/or translating the output of the energy source 20 relative to the substrate 10.

The substrate 10 may be positioned on a heat exchanging device 15 configured to control over all temperature of the substrate 10. The heat exchange device 15 may be positioned on one or more conventional electrical actuators 17 (e.g., linear motor, lead screw and servo motor), which may be part of a separate precision stage (not shown), configured to control the movement and position of substrate 10. Conventional precision stages that may be used to support and position the substrate 10, and the heat exchanging device 15, may be purchased from Parker Hannifin Corporation, of Rohnert Park, Calif.

In one aspect, the anneal region 12 is sized to match the size of the die 13 (e.g., 40 "die" are shown in FIG. 1), or semiconductor devices (e.g., memory chip), that are formed on the surface of the substrate 10. In one aspect, the boundary of the anneal region 12 is aligned and sized to fit within the "kurf" or "scribe" lines 10A that define the boundary of each die 13.

Sequentially placing anneal regions 12 so that they only overlap in the naturally occurring unused space/boundaries between die 13, such as the scribe or kurf lines 10A, reduces the need to overlap the energy in the areas where the devices are formed on the substrate 10 and thus reduces the variation in the process results between the overlapping anneal regions 12.

In one embodiment, prior to performing the annealing process the substrate 10 is aligned to the output of the energy source 20 using alignment marks typically found on the surface of the substrate 10 and other conventional techniques so that the anneal region 12 can be adequately aligned to the die 13.

This technique has advantages over conventional processes that sweep an energy source across the surface of a substrate, since the need to tightly control the overlap between adjacently scanned regions to assure uniform annealing across the desired regions of the substrate is not an issue due to the confinement of the overlap to the unused space between die 13.

Confining the overlap to the unused space/boundary between die 13 also improves process uniformity results versus conventional scanning anneal type methods that utilize adjacent overlapping regions that traverse all areas of the substrate. Therefore, the amount of process variation, due to the varying amounts of exposure to the energy delivered from the energy source 20 to process critical regions of the substrate is minimized, since any overlap of delivered energy between the sequentially placed anneal regions 12 can be minimized. In one example, each of the sequentially placed anneal regions 12 is rectangular region.

The energy source 20 is generally adapted to deliver electromagnetic energy to preferentially melt certain desired regions of the substrate surface. Typical sources of electromagnetic energy include, but are not limited to an optical radiation source (e.g., laser), an electron beam source, an ion beam source, and/or a microwave energy source.

In one embodiment, the substrate 10 is exposed to a pulse of energy from a laser that emits radiation at one or more appropriate wavelengths for a desired period of time. In one embodiment, pulse of energy from the energy source 20 is tailored so that the amount of energy delivered across the anneal region 12 and/or the amount of energy delivered over the period of the pulse is optimized to enhance preferential melting of certain desired areas. In one embodiment, the wavelength of the laser is tuned so that a significant portion of the radiation is absorbed by a silicon layer disposed on the substrate 10.

For laser anneal process performed on a silicon containing substrate, the wavelength of the radiation is typically less than about 800 nm, and can be delivered at deep ultraviolet (UV), infrared (IR) or other desirable wavelengths. In one embodiment, the energy source 20 is an intense light source, such as a laser, that is adapted to deliver radiation at a wavelength between about 500 nm and about 11 micrometers. In either case, the anneal process generally takes place on a given region of the substrate for a relatively short time, such as on the order of about one second or less.

In one embodiment, energy is delivered to each anneal region 12 for a very short time to melt the surface of the substrate 10 to a sharply defined depth, for example, less than 0.5 micrometers. The exact depth is determined by the size of the electronic device being manufactured and/or the actual annealing process. For example, in an implant annealing process, the amount of energy delivered to the surface of the substrate 10 is configured so that the melt depth does not extend beyond the amorphous depth defined by the amorphization implant step. Deeper melt depths facilitate the diffusion of dopant from the doped amorphous layers into the undoped molten layers. Such undesirable diffusion would sharply and deleteriously alter the electrical characteristics of the circuits on the semiconductor substrate.

In general, the substrate 10 is placed within an enclosed processing environment (not shown) of a processing chamber (not shown) that contains the heat exchanging device 15. The processing environment within which the substrate 10 resides during processing may be evacuated or contain an inert gas that has a low partial pressure of undesirable gases during processing, such as oxygen.

In one embodiment, it may be desirable to control the temperature of the substrate 10 during thermal processing by placing a surface of the substrate 10, illustrated in FIG. 1, in thermal contact with a substrate supporting surface 16 of the heat exchanging device 15. The heat exchanging device 15 is generally adapted to heat and/or cool the substrate 10 prior to or during the annealing process. In this configuration, the heat exchanging device 15, such as a conventional substrate heater available from Applied Materials Inc., Santa Clara, Calif., may be used to improve the post-processing properties of the annealed regions of the substrate 10.

In one embodiment, the substrate may be preheated prior to performing the annealing process so that the energy required to reach the melting temperature is minimized, which may reduce any induced stress due to the rapid heating and cooling of the substrate 10 and also possibly reduce the defect density in the resolidified areas of the substrate 10. In one aspect, the heat exchanging device 15 contains resistive heating elements 15A and a temperature controller 15C that are adapted to heat a substrate 10 disposed on the substrate supporting surface 16. The temperature controller 15C is in communication with the controller 21 (discussed below).

In one aspect, it may be desirable to preheat the substrate to a temperature between about 20° C. and about 750° C. In one embodiment, where the substrate is formed from a silicon containing material it may be desirable to preheat the substrate to a temperature between about 20° C. and about 500° C. In another embodiment, where the substrate is formed from a silicon containing material it may be desirable to preheat the substrate to a temperature between about 200° C. and about 480° C. In another embodiment, where the substrate is formed from a silicon containing material it may be desirable to preheat the substrate to a temperature between about 250° C. and about 300° C.

In another embodiment, it may be desirable to cool the substrate during processing to reduce any interdiffusion due to the energy added to the substrate during the annealing process and/or increase the regrowth velocity after melting to increase the amorphization of the various regions during processing. In one configuration, the heat exchanging device 15 contains one or more fluid channels 15B and a cryogenic chiller 15D that are adapted to cool a substrate disposed on the substrate supporting surface 16. In one embodiment, a conventional cryogenic chiller 15D, which is in communication with the controller 21, is adapted to deliver a cooling fluid through the one or more fluid channels 15B. In one aspect, it may be desirable to cool the substrate to a temperature between about −240° C. and about 20° C.

Further description of pulsed annealing process may be found in U.S. patent application Ser. No. 11/459,847, entitled "Method of Thermal Processing Structures Formed on a Substrate", filed Jul. 25, 2006, which is incorporated herein by reference.

During a pulsed laser anneal process, a substrate being processed moves relatively to an energy source so that portions of the substrate are exposed to the energy source sequentially. The relative movement may be stepping motion. For example, the substrate may be moved to and maintained at a first position so that a first area on the substrate is aligned with the energy source. The energy source is then project desired amount of energy toward the first area on the substrate. The substrate is then moved to a second position to a second area with the energy source. The relative movement between the substrate and the energy source is stopped temporarily when the energy source projects energy to the substrate so that the energy is projected precisely and uniformly to a desired area. However, this stepping motion involves accelerating and decelerating in every step which significantly slows the down the process.

Embodiments of the present invention comprises moving a substrate in a constant speed relative to an energy source when projecting a pulsed energy to the substrate. The system throughput is significantly increased by eliminating accelerating, decelerating, and stopping for each area on the substrate.

Figure 2A:
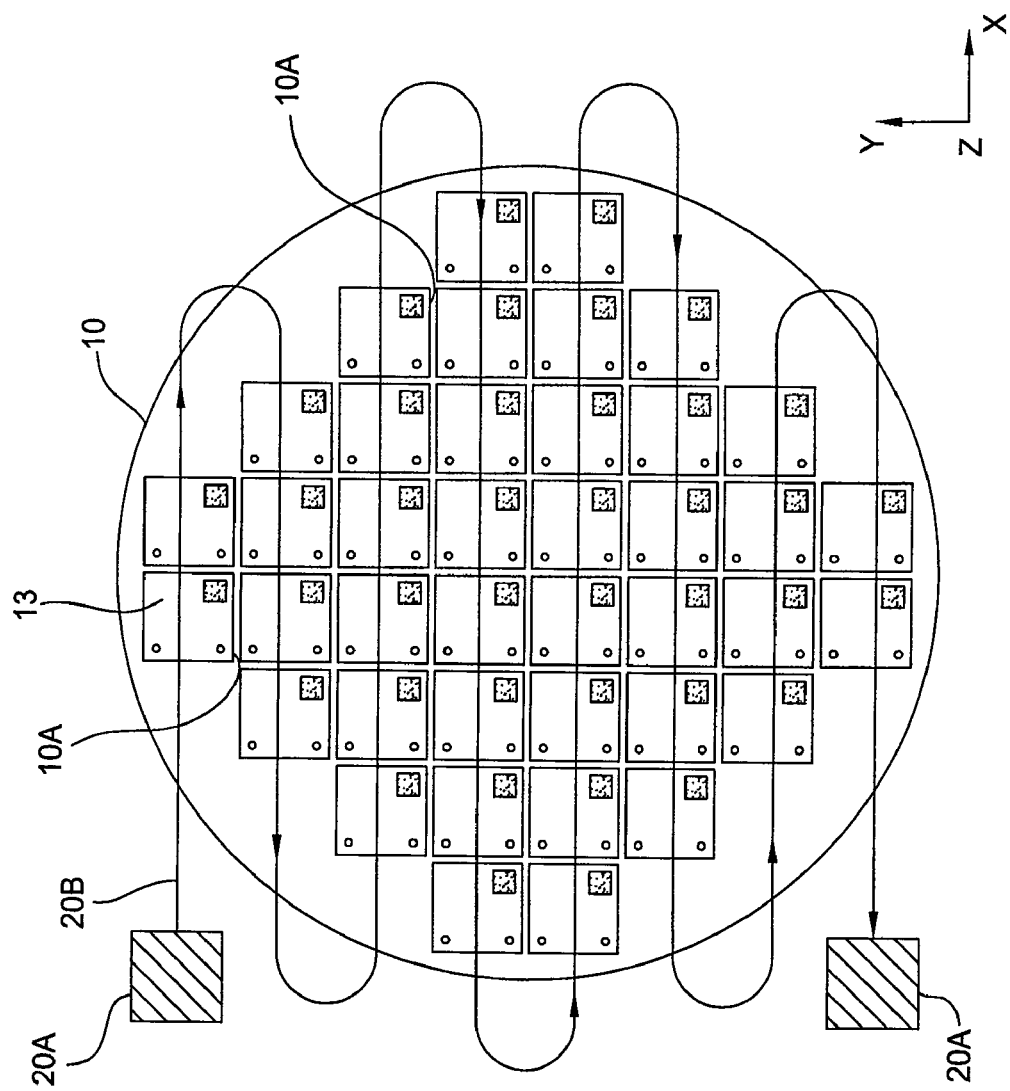
FIG. 2A schematically illustrates a top view of a substrate being processed showing a relative movement between the substrate being processed and an anneal region of an energy source.

FIG. 2A schematically illustrates a top view of a substrate 10 that contains forty square shaped dies 13 that are arranged in an array. The dies 13 are separated from one another by areas marked by scribe lines 10A. Energy projection region 20A indicates the area over which energy source 20 (shown in FIG. 1) is adapted to deliver an energy pulse. In general, the energy projection region 20A may cover an area equal to or greater than the area of each die 13, but smaller than the area of each die 13 plus the area of the surrounding scribe lines 10A, so that the energy pulse delivered in the energy projection region 20A completely covers the die 13 while not overlapping with the neighboring dies 13.

To perform the annealing process on multiple dies 13 spread out across the substrate surface, the substrate and/or the output of the energy source 20 need s to be positioned and aligned relative to each die. In one embodiment, curve 20B illustrates a relative movement between the dies 13 of the substrate 10 and the energy projection region 20A of the energy source 20, during a sequence of annealing process as that are performed on each die 13 on the surface of the substrate. In one embodiment, the relative movement may be achieved by translating the substrate in x and y direction so that they follow the curve 20B. In another embodiment, the relative movement may be achieved by moving the energy projection region 20A relative to a stationary substrate 10.

Additionally, a path different than 20B may be used to optimize throughput and process quality depending on a particular arrangement of dies.

In one embodiment, during an annealing process, the substrate 10 moves relatively to the energy projection region 20A, such as shown by curve 20B of FIG. 2A. When a particular die 13 is positioned and aligned within the energy projection region 20A, the energy source 20 projects a pulse of energy towards the substrate 10 so that the die 13 is exposed to a certain amount of energy over a defined duration according to the particular anneal process recipe. The duration of the pulsed energy from the energy source 20 is typically short enough so that the relative movement between the substrate 10 and the energy projection region 20A does not cause any "blur", i.e. non uniform energy distribution, across each die 13 and it will not cause damage to the substrate.

Figure 2B:
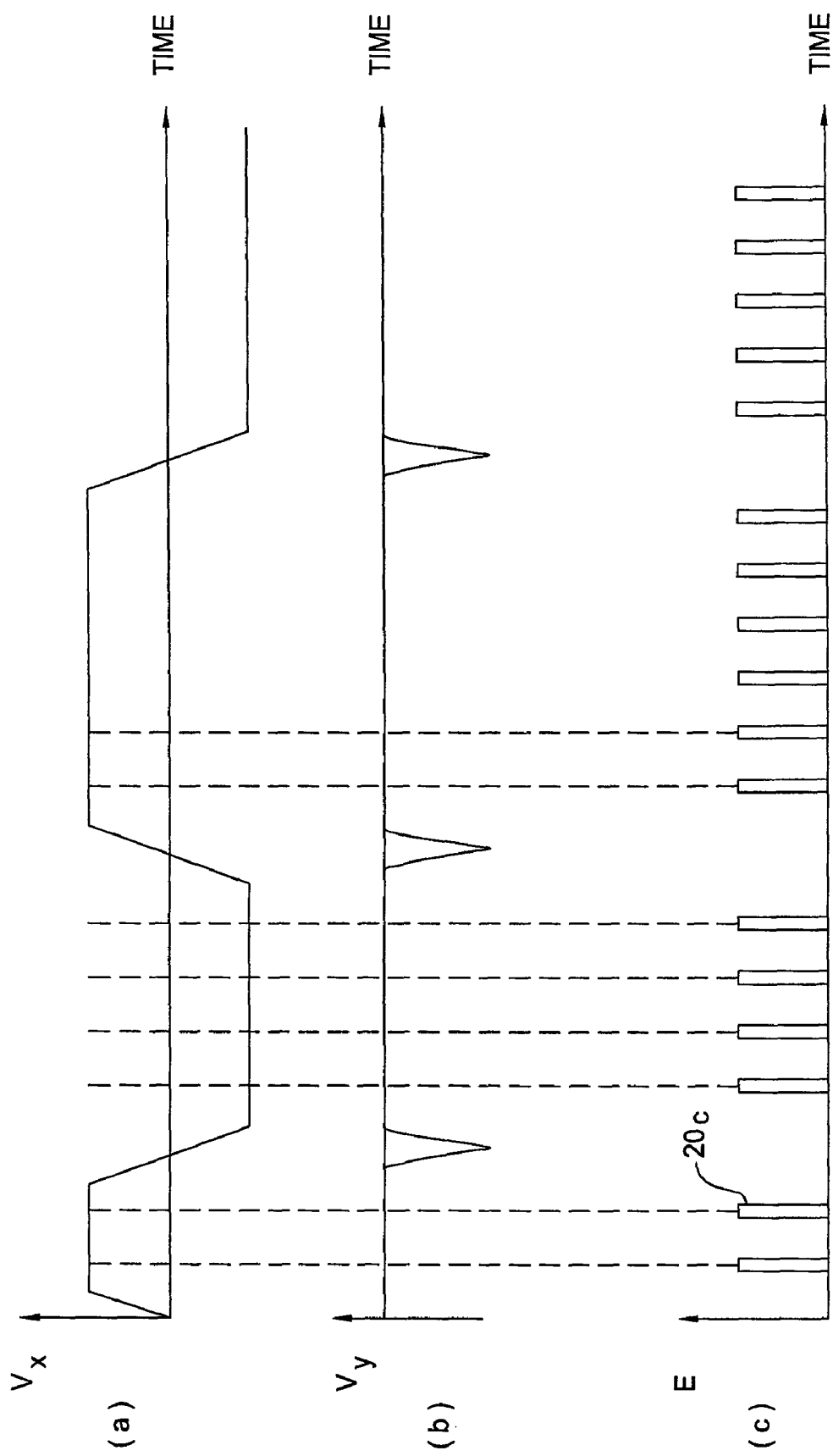
FIG. 2B schematically illustrates a flow chart of energy pulses and relative movement between a substrate and the energy source in accordance with one embodiment of the present invention.

FIG. 2B schematically illustrates an exemplary of a timing chart for a pulsed annealing process that is performed on multiple dies 13 on a substrate 10 in accordance with one embodiment of the present invention. Chart (a) schematically illustrates a relative speed of the substrate 10 to the energy projection region 20A along the x direction. Chart (b) schematically illustrates a relative speed of the substrate 10 and the energy projection region 20A along the y direction. Chart (c) schematically illustrates a plurality of pulses 20C delivered from the energy source 20. As shown in FIG. 2B, during the annealing process, the substrate 10 maintains a substantially steady movement relative to the energy source 20, and the energy source 20 only projects pulses of short duration to the various dies 13 found on the moving substrate 10. The substrate 10 is moving at a constant speed relative to the energy source 20 during the energy pulses 20C as marked by the dashed lines. The constant speed makes it easier to control the timing of the pulses 20C and the uniformity of energy projected to each die 13. The dips in Chart (b) illustrates that the substrate 10 accelerates and decelerates along y direction so that the energy source 20 may be aligned with dies 13 in a new row. The slope lines in Chart (a) illustrate the substrate changing direction of movement after reaches an end of a row of dies 13. Thus, the substrate 10 only accelerates and/or decelerates when moving from one row of dies 13 to another row of dies 13, which increases system throughput.

In another embodiment, the relative movement between the substrate 10 and energy source 20 may be slowed down or halted so that the energy source 20 can project a pulse of energy to a die 13, and then accelerated and slowed down, or halted so that the energy source 20 can project a pulse of energy to an adjacent die 13.

Figure 2C:
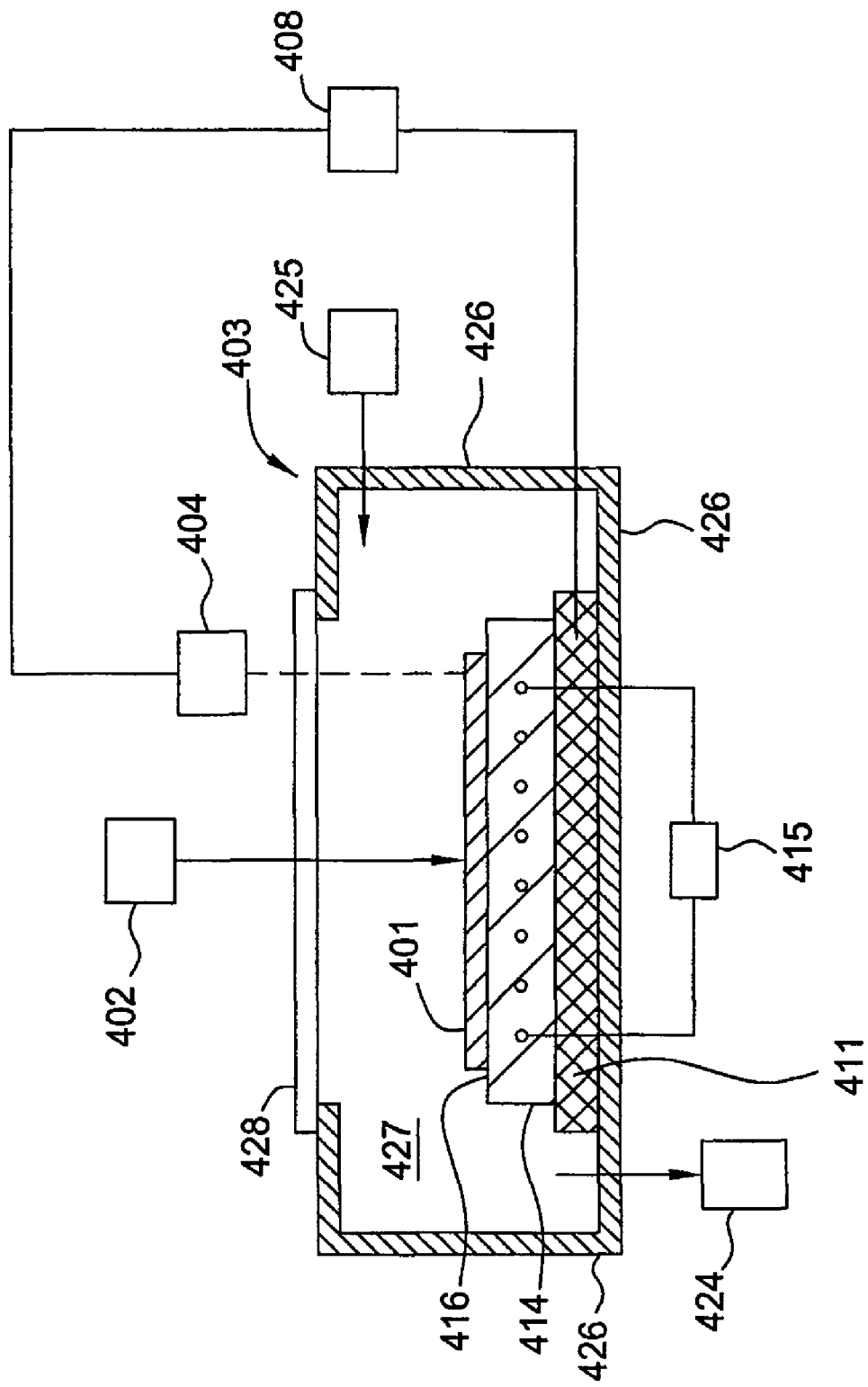
FIG. 2C schematically illustrates an anneal chamber 402 in accordance with one embodiment of the present invention.

FIG. 2C schematically illustrates an anneal chamber 403 in accordance with one embodiment of the present invention. The pulsed annealing method described above may be performed in the anneal chamber 403. The anneal chamber 420 comprises an optically transparent window 428 formed on a chamber body 426. The chamber body 426 defines a processing volume 427. In one embodiment, the processing volume 427 be have an inert environment maintained by an inert gas source 425 and a vacuum pump 424 connected to the processing volume 427.

A substrate support 414 is deposed in the processing volume 427. The substrate support 414 is configured to support and move a substrate 401 disposed on a top surface 416. An energy source 402 is positioned outside the chamber body 426 and is configured to project energy through the optically transparent window 428. The substrate support 414 is connected to a temperature control unit 415 having cooling and heating capacities for the substrate 401 disposed on the substrate support 414. The substrate support 414 may be connected to high precision stages 411 which precise alignment and relative movement between the substrate 401 and the energy source 402 during anneal.

In one embodiment, an optical sensor 404 may be used to assist alignment of the substrate 401 with the energy source 402. The optical sensor 404 may be positioned near the optically transparent window 428 and connected to a control unit 408 which is further connected to the high precision stage 411. During alignment, the optical sensor 404 may "look" through the optically transparent window 428 to locate visual markers on the substrate 401, for example a notch, and a scribe line around a die. The control unit 408 processes signal from the optical sensor 404 and generates control signals to the high precision stage 411 for alignment adjustment.

Figure 3:
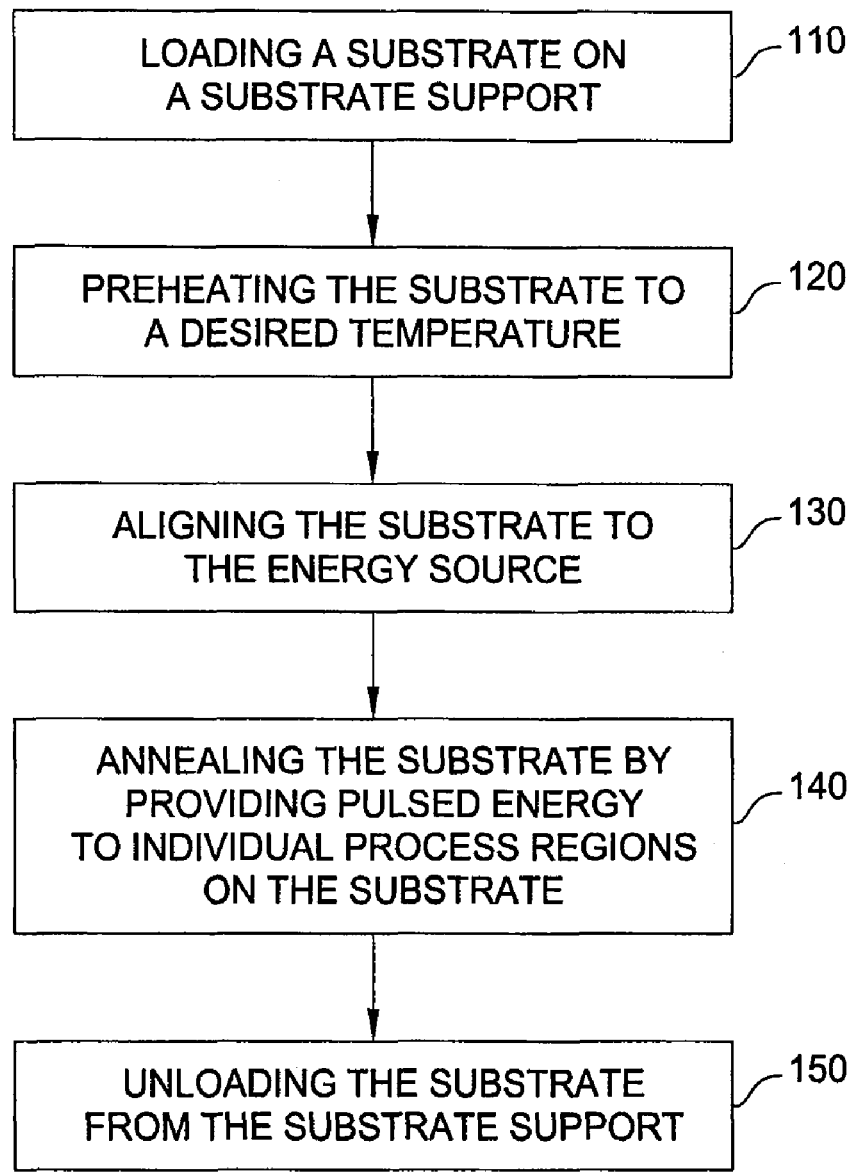
FIG. 3 illustrates a flow chart including typical steps for performing an anneal process in accordance with one embodiment of the present invention.

FIG. 3 illustrates a flow chart including typical steps for performing an anneal process in accordance with one embodiment of the present invention.

In step 110, a substrate being processed is loaded on a substrate supporting surface 16 of a process chamber. Loading the substrate is typically performed by a robot configured to handle substrates.

In step 120, the substrate may be preheated to a desired temperature prior to performing the annealing process. In one embodiment, as showing in FIG. 1, the preheating step is completed by placing the substrate 10 on a heated substrate supporting surface 16. Preheating the substrate may minimize energy required from the energy source 20 in each energy pulse, which may allow a smaller energy source to be used and/or and/or shorten pulse duration, thus improve throughput. Preheating may be achieved by powering resistive heating elements embedded in the substrate support.

In step 130, the preheated substrate may be aligned with the energy source so that an energy projection region 20A of the energy source 20 can reliably cover a desired region on the substrate supporting surface 16, such as a die 13 on the substrate at each energy pulse. Alignment may be achieved by identifying features on the substrate 10, such as a substrate notch or a formal alignment marker using a visual method. Due to the relatively high precision requirement of the alignment of the energy projection region 20A and each die 13, the aligning step usually takes a long time.

In step 140, the annealing processed may be performed by exposing the desired regions, such as the dies 13, to the energy source one by one, or in groups.

In step 150, after the annealing process has been performed on all the dies 13, the substrate 10 may be unloaded from the substrate supporting surface 16 by a robot.

The pulsed anneal process described above generally requires an energy source 20 that can deliver high power density. An energy source in accordance with embodiments of the present invention may include, but not limited to, an optical radiation source, e.g. laser, an electron beam source, an ion beam source, or a microwave energy source. The energy source is configured to emit electromagnetic energy at a desired energy density ($W/cm^2$) and/or pulse duration to a certain desired region. Energy sources of this type can be expensive. Therefore, it is desirable to reduce idle time of the energy source, thus, increasing throughput and reducing the system's cost of ownership.

Figure 4A:
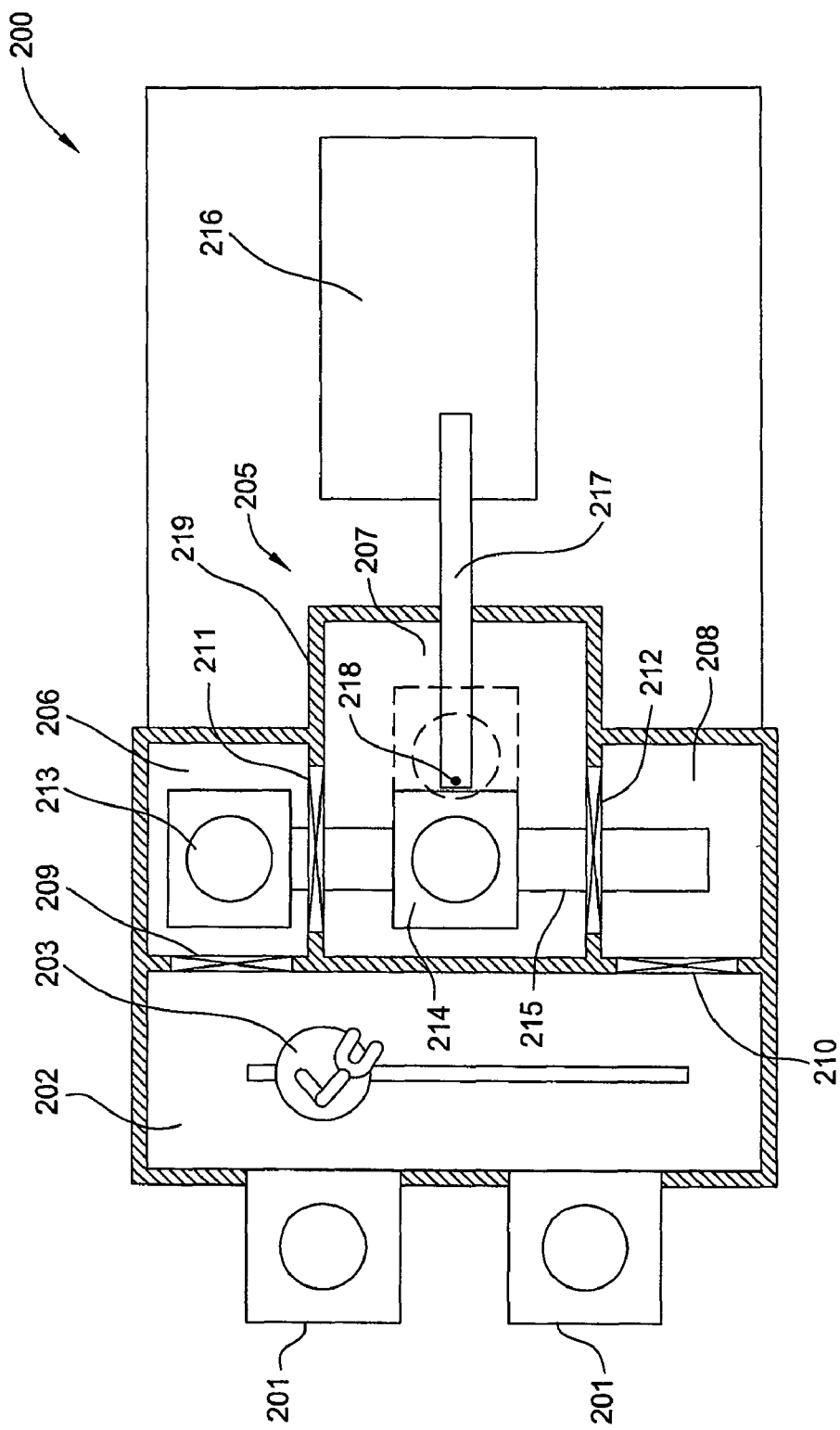
FIG. 4A schematically illustrates a top view of a first processing position of a pulsed anneal system in accordance with one embodiment of the present invention.
Figure 4B:
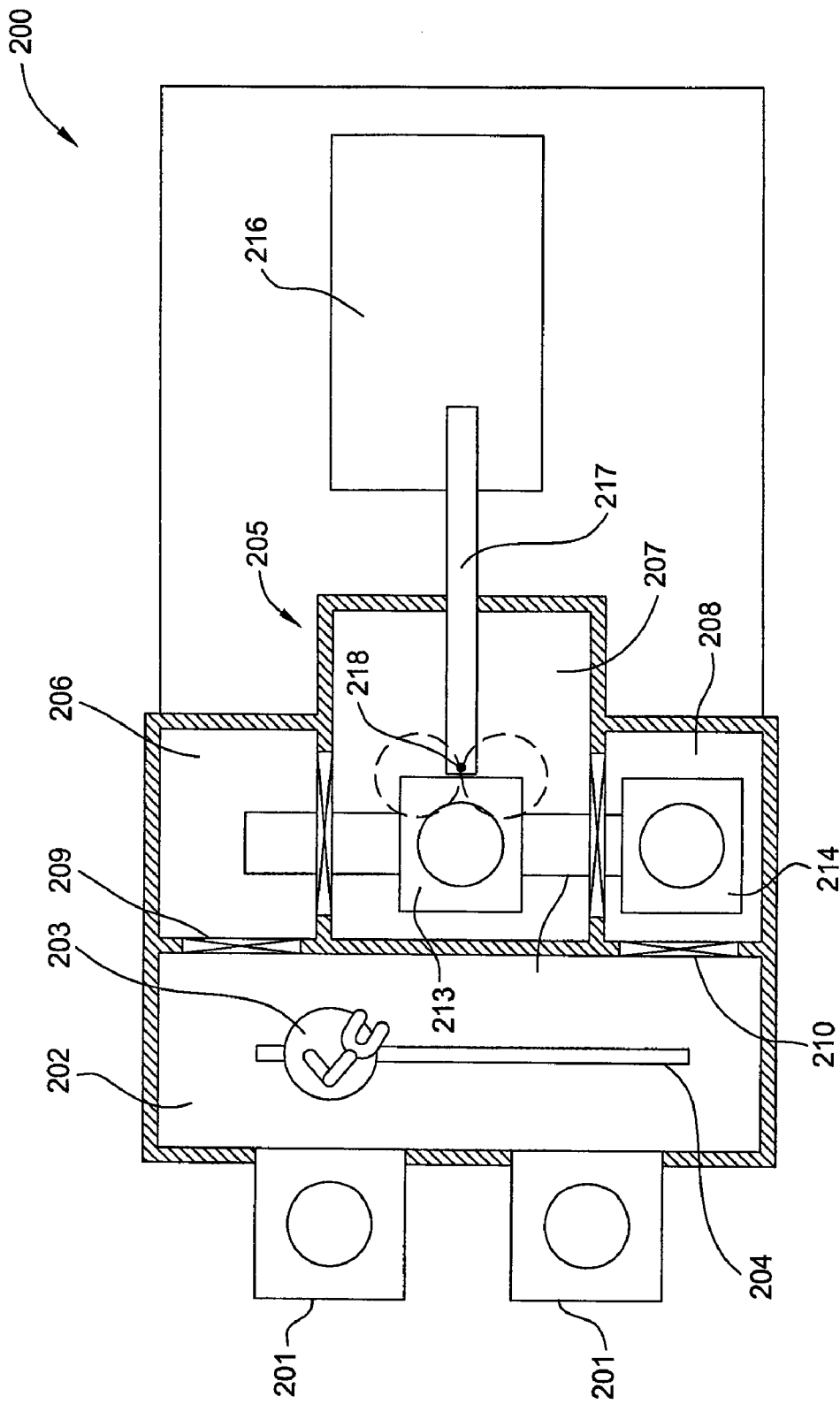
FIG. 4B schematically illustrates a top view of a second processing position of the pulsed anneal system of FIG. 4A.

In a typical annealing process, such as the annealing process described in FIG. 3, the energy source is idle during loading, preheating, aligning and unloading steps. FIGS. 4A-4B schematically illustrate an anneal processing system 200 in accordance with one embodiment of the present invention. The anneal processing system 200 is configured to minimize idle time of an energy source and improve throughput.

FIG. 4A schematically illustrates a plan view of the anneal processing system 200 in a first processing position.

The anneal processing system 200 comprises a front-end environment 202 (also referred to as a factory interface, or FI). One or more pods 201 that are coupled to the front-end environment 202. The one or more pods 201 are configured to store and retain a plurality of substrates. The front-end environment 202 is in selective communication with a processing chamber 205 configured to perform an annealing process therein.

A factory interface robot 203 is disposed in the front-end environment 202. The factory interface robot 103 is configured to transfer substrates between the pods 201 and the processing chamber 205. The factory interface robot 203 may be movable along a track 204.

The anneal processing system 200 further comprises two substrate support assemblies 213, 214 that are movably disposed in the processing chamber 205, and are each configured to support and transfer a substrate within the processing chamber 205.

In one embodiment, the processing chamber 205 comprises a chamber body 219 forming a processing zone 207 that is connected to loading zones 206, 208 that are disposed on opposite sides of the processing zone 207. The substrate support assemblies 213, 214 are movable between the processing zone 207 and the loading zones 206, 208. The processing zone 207 is configured to alternately accommodate the substrate support assemblies 213, 214 during processing. The loading zones 206, 208 are configured to accommodate the substrate support assemblies 213 and communicate with the factory interface robot 203. The loading zones 206, 207 is configured to accommodate the substrate support assemblies 213, 214 respectively during loading and unloading substrates.

In one embodiment, the substrate support assemblies 213, 214 may be coupled to a shuttle 215 and are spaced a fixed distance apart. The shuttle 215 is configured to move the substrate support assemblies 213, 214 simultaneously so that one of the substrate support assemblies 213, 214 is positioned in the processing zone 207 while the other is positioned in its respective loading zone, i.e. loading zones 206, 208. In another embodiment, the substrate support assemblies 213, 214 may be independently movable relative to each other.

In one embodiment, the processing chamber 205 may be in a controlled environment during processing. The processing chamber 205 may be in selective communication with the front-end environment 202 via slit valve door 209, 210. The slit valve doors 209, 210 may be positioned so that the factory interface robot 203 may drop off and pick up a substrate to and from the substrate support assemblies 213, 214 positioned in the loading zones 206, 208 respectively.

In one embodiment, the processing zone 207 may be in a controlled environment during processing. The loading zones 206, 208 may be connected to the processing zone 207 via doors 211, 212. The doors 211, 212 may be closed and sealed during processing so that the processing zone 207 is fluidly insolated from the loading zones 206, 208. The doors 211, 212 may be closed to retain undesired species generated during thermal processing within the processing zone 207, and/or to keep species in loading zones 206, 208 from entering the processing zone 207. In one embodiment, an inert ambient environment may be formed in the processing zone 207 by flowing one or more inert gases therein. In another embodiment, the environment of the processing zone 207 is controlled by the flow of an inert gas from an inter gas source and a vacuum pump system. In one embodiment, the processing zone 207 may predominantly contain nitrogen with oxygen concentration at less than 100 ppm. During process, a gas environment may be maintained in the processing region 207 while the loading stations 206, 208 are open to atmosphere. In one embodiment, a lock lock may be positioned between the processing region 207 and each loading station 206, 208. In another embodiment, the loading stations 206, 208 may serve as load locks.

The anneal processing system 200 further comprise an energy source 216 configured to deliver pulsed electromagnetic energy to the processing zone 207. In one embodiment, the energy source 216 may be disposed outside the processing chamber 205. In one embodiment, the energy source 216 may be configured to deliver pulsed electromagnetic energy to an anneal region 218 within the processing zone 207 via a light train 217. The light train 217 is connected to the energy source 216 and configured to relay a pulsed energy towards the processing zone 207.

In one embodiment, the energy source 216 may be a laser source that is adopted to deliver energy at a wavelength of 532 nm, or 1064 nm, or 748 nm. In one embodiment, the energy source 216 may project pulsed energy with pulse length of between about 8 ns to about 30 ns. In another embodiment, the pulse length of the energy source 216 may be about 20ns. In one embodiment, the energy source 216, in each pulse, may project electromagnetic energy to the anneal region 218 that is positioned over a die 13 at energy level from about 5 Joules to about 15 Joules. In one embodiment, the anneal region 218 may have a size of between 10 mm by 10 mm to about 26 mm by 26 mm. In one embodiment, the energy source 216 may project pulsed energy to the anneal region 218 at density of about 0.5 Joules/cm$^2$ to about 1.5 Joules/cm$^2$.

The anneal processing system 200 is configured to minimize idle time of the energy source 216 and increase system throughput. The two substrate support assemblies 213, 214 are positioned in the processing zone 207 and the loading zones 206, 208 alternately so that the energy source 216 does not stay idle during substrate loading, and unloading steps. In one embodiment, the loading steps include receiving a substrate, preheating the substrate, chucking the substrate, and aligning the substrate.

In one embodiment, loading, preheating, chucking, and unloading steps may be performed in the loading zones 206, 208. In another embodiment, a rough aligning step may also be performed in the loading zone 206, 208 to speed subsequent aligning step performed in the processing zone 207 thus further reducing idle time of the energy source 216.

In the processing zone 207, an aligning step may be performed to align a substrate being processed with the anneal region 218 of the energy source. Anneal may be performed region by region after the aligning step as the substrate is moved relative to the anneal region 218. Aligning may require translating and rotating the substrate.

FIG. 4A illustrates a first position of the anneal processing system 200 where the substrate support assembly 213 is positioned in the loading zone 206 and the substrate support assembly 214 is positioned in the processing zone 207. FIG. 4B illustrates a second position of the anneal processing system 200 wherein the substrate support assembly 214 is positioned in the loading zone 208 and the substrate support assembly 213 is positioned in the processing zone 207 so that a substrate can be loaded to and unloaded from the substrate support assembly 214 and the anneal process can be performed on a substrate positioned on the substrate support assembly 213. The transition between the first position and the second position may be achieved by a linear movement of the shuttle 215 on which the substrate support assemblies 213, 214 are positioned.

Figure 5A:
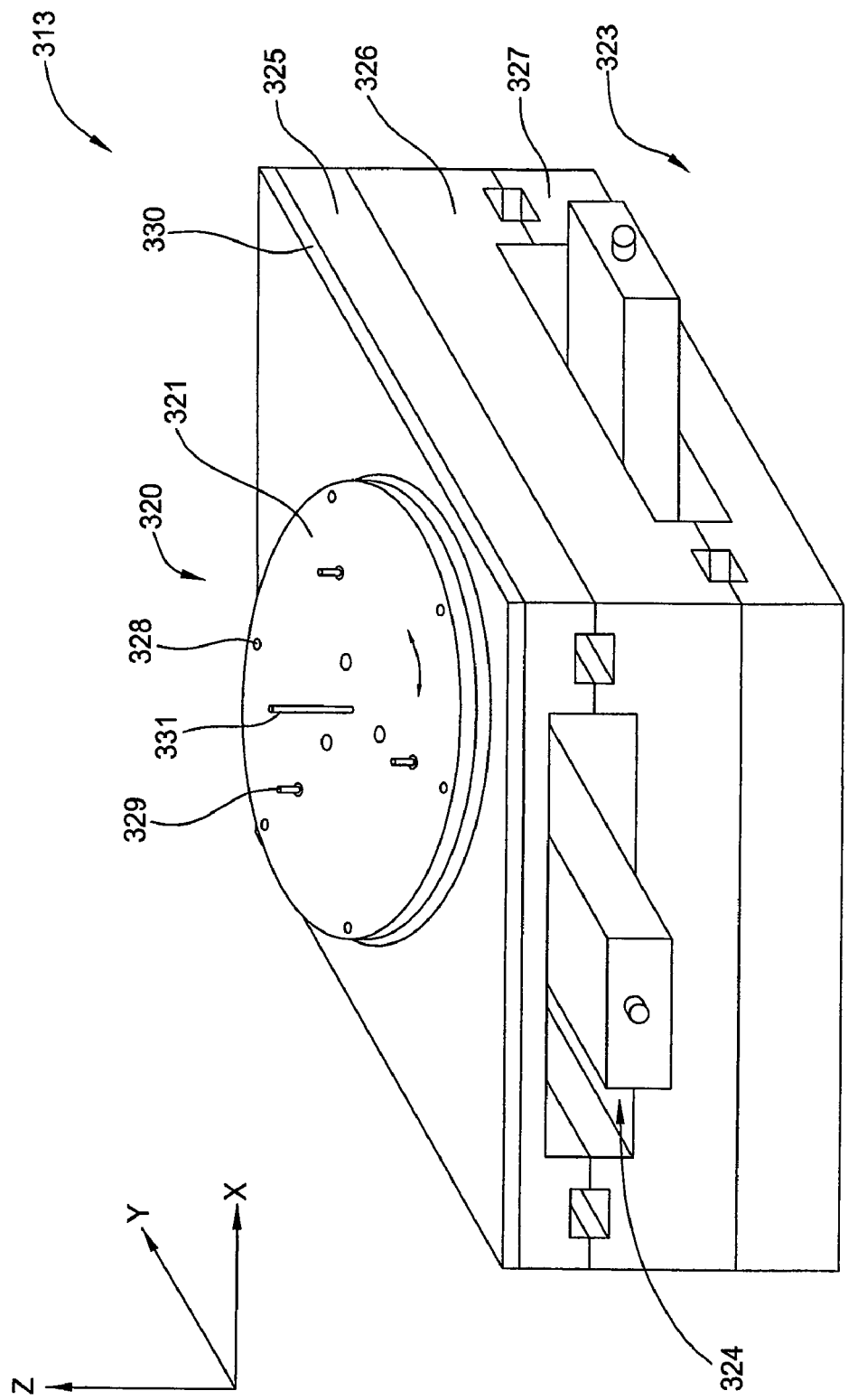
FIG. 5A schematically illustrates an isometric view of a substrate support assembly in accordance with one embodiment of the present invention.

FIG. 5A schematically illustrates an isometric view of a substrate support assembly 313 in accordance with one embodiment of the present invention. The substrate support assembly 313 may be the substrate support assemblies 213, 214 that are coupled to the shuttle 215 of the anneal processing system 200 illustrated in FIG. 2A.

The substrate support assembly 313 comprises a substrate chuck 320 that has a top surface 321 that is configured to support and secure a substrate. In one embodiment, the substrate chuck 320 comprises temperature control means configured to heat and/or cool a substrate positioned on the top surface 321. The substrate chuck 320 may use one or more embedded resistive heaters to (not shown) heat a substrate. The substrate chuck 320 may comprise cooling pipes (not shown) configured for cooling the substrate by flowing cooling fluid therein. In one embodiment, the substrate chuck 320 may heat a substrate to a temperature range between about 20° C. to about 500° C. In one embodiment, the cooling pipes in the substrate chuck 320 may be used to provide cooling to the substrate during annealing to avoid overheating.

In one embodiment, the substrate chuck 320 may be coupled to a vacuum means to chuck a substrate to the top surface 321. A plurality of openings 328 that are connected to a vacuum source are formed in the top surface 321 to secure a substrate thereon. In another embodiment, electrostatic means may be used to secure a substrate to the top surface 321.

In one embodiment, three or more retractable pins 329 may be disposed evenly across the top surface 321. The retractable pins 329 may be used to receive and transfer substrates with a robot. In one embodiment, the retractable pins 329 may keep a substrate slightly elevated from the top surface 321 during a heating process, so that thermal expansion of the substrate during heating does not cause friction between a backside of the substrate and the top surface 321 therefore reduce particle generation and thermal stress in the substrate.

In one embodiment, the substrate chuck 320 is coupled to a theta plate 330. The theta plate 330 is movably coupled to a first stage plate 325. The theta plate 330 along with the substrate chuck 320 is rotatable about a central axis 331 relative to the first stage plate 325. In one embodiment, the theta plate 330 may rotate several degrees relative to the first stage plate 325 to assist in the angular alignment between a die and the energy projection region 20A (FIG. 2A) delivered from a pulsed energy source.

The first stage plate 325 is movably coupled to a second stage plate 326. A first stage 324 is coupled to the first stage plate 325 and the second stage plate 326, is coupled to a second stage 323. The first stage 324 is configured to translate the first stage plate 325 relative to the second stage plate 326 along a first direction, e.g. y-direction.

The second stage plate 326 is movably coupled to a bottom plate 327 through the second stage 323 and is adapted to move the second stage plate 326 along the second direction, e.g. x-direction. The second stage 323 is configured to translate the second stage plate 326, the first stage plate 325, and the first stage 324 relative to the bottom plate 327. In one embodiment, the first stage 324 may be positioned orthogonally to the second stage 323. In one embodiment, the central axis 331 is orthogonal to both the first stage 324 and the second stage 323.

The substrate support assembly 313 is capable of align a substrate in a processing chamber by rotating the substrate about the central axis 331 and translating the substrate along the first stage 324 and the second stage 324. The first and second stages 324, 323 may be any suitable high precision stages.

The bottom plate 327 may be further coupled to a mechanism, such as the shuttle 215, that is configured to move the entire substrate support assembly 313.

Figure 5C:
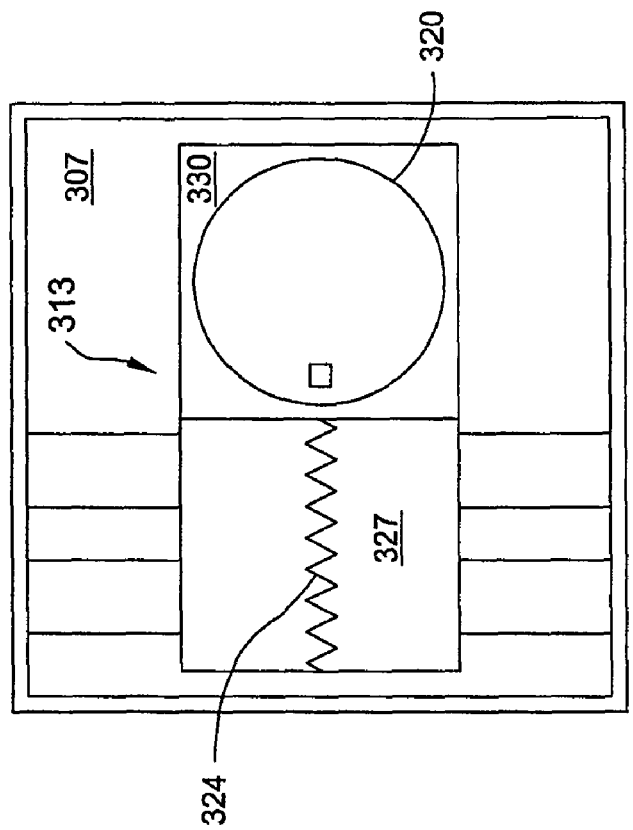
FIGS. 5B-E schematically illustrates top views of the substrate support assembly of FIG. 5A in processing positions.
Figure 5B:
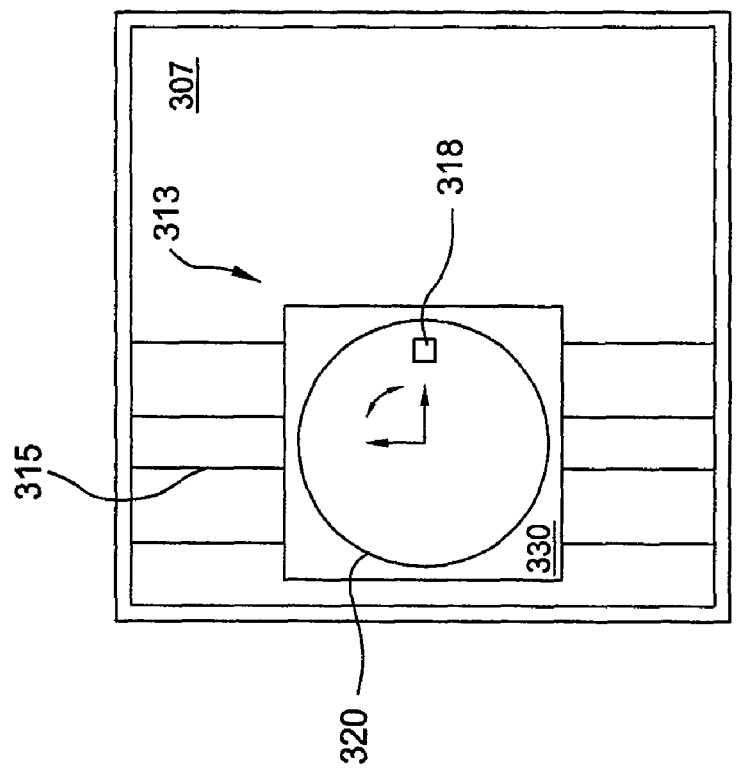

FIGS. 5B-C schematically illustrates top views of the substrate support assembly 313 of FIG. 5A in various processing positions with the processing zone 207. As shown in FIG. 5B, the substrate support assembly 313 is positioned in a processing chamber 307 which may be similar to the processing chamber 205 discussed above. In one embodiment, the substrate support assembly 313 may be transferred in and out the processing chamber 307 by a shuttle 315 which may be similar to the shuttle 215 discussed above. The substrate support assembly 313 may be used to translate a substrate during process so that regions of the substrate may be aligned with a processing region 318, e.g. energy projection region 20A found within the processing chamber 307. In one embodiment, the processing chamber 307 may be a pulsed anneal chamber and the processing region 318 may be an anneal region. In one embodiment, the processing chamber 307 may be large enough to allow the substrate support assembly 313 to be positioned so that any die 13 on a substrate can be aligned with the processing region 318.

Figure 5D:
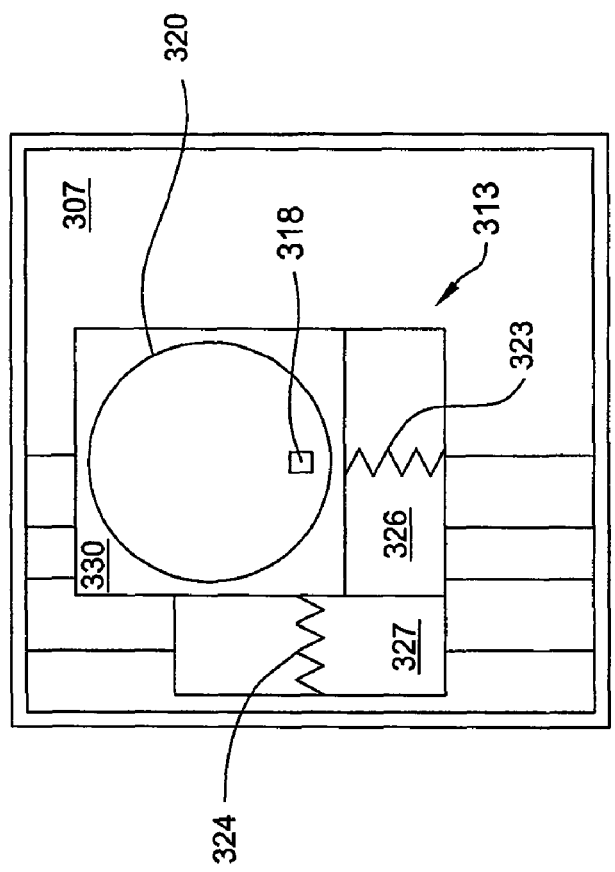
Figure 5E:
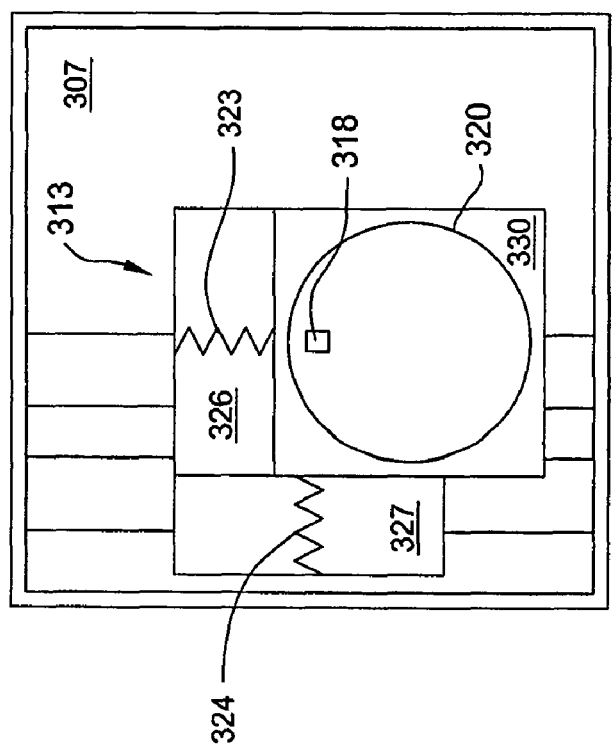

The processing region 318 may be positioned such that the any portion of the substrate disposed on the substrate support assembly 313 may be aligned with the processing region 318. FIG. 5B illustrates the processing region 318 being aligned with the substrate at the most right area. FIG. 5C illustrates the processing region 318 being aligned with the substrate at the most left area of the substrate. FIG. 5D illustrates the processing region 318 being aligned with the substrate at the top area of the substrate. FIG. 5E illustrates the processing region 318 being aligned with the substrate at the bottom area of the substrate. The processing region 318 may be aligned with any area of the substrate within between the most left area and the most right area, and between the top area and the bottom area.

In one embodiment, the alignment of the substrate and processing region 318 may be performed using a visual method. A visual sensor, such as a camera, may be positioned to view the substrate positioned within the processing chamber 307 and used to recognize one or more markers on the substrate to achieve alignment. In one embodiment, the marker may be a notch formed on an edge of the substrate being processed. In another embodiment, the marker may be pattern formed on a surface of the substrate being processed.

Figure 6:
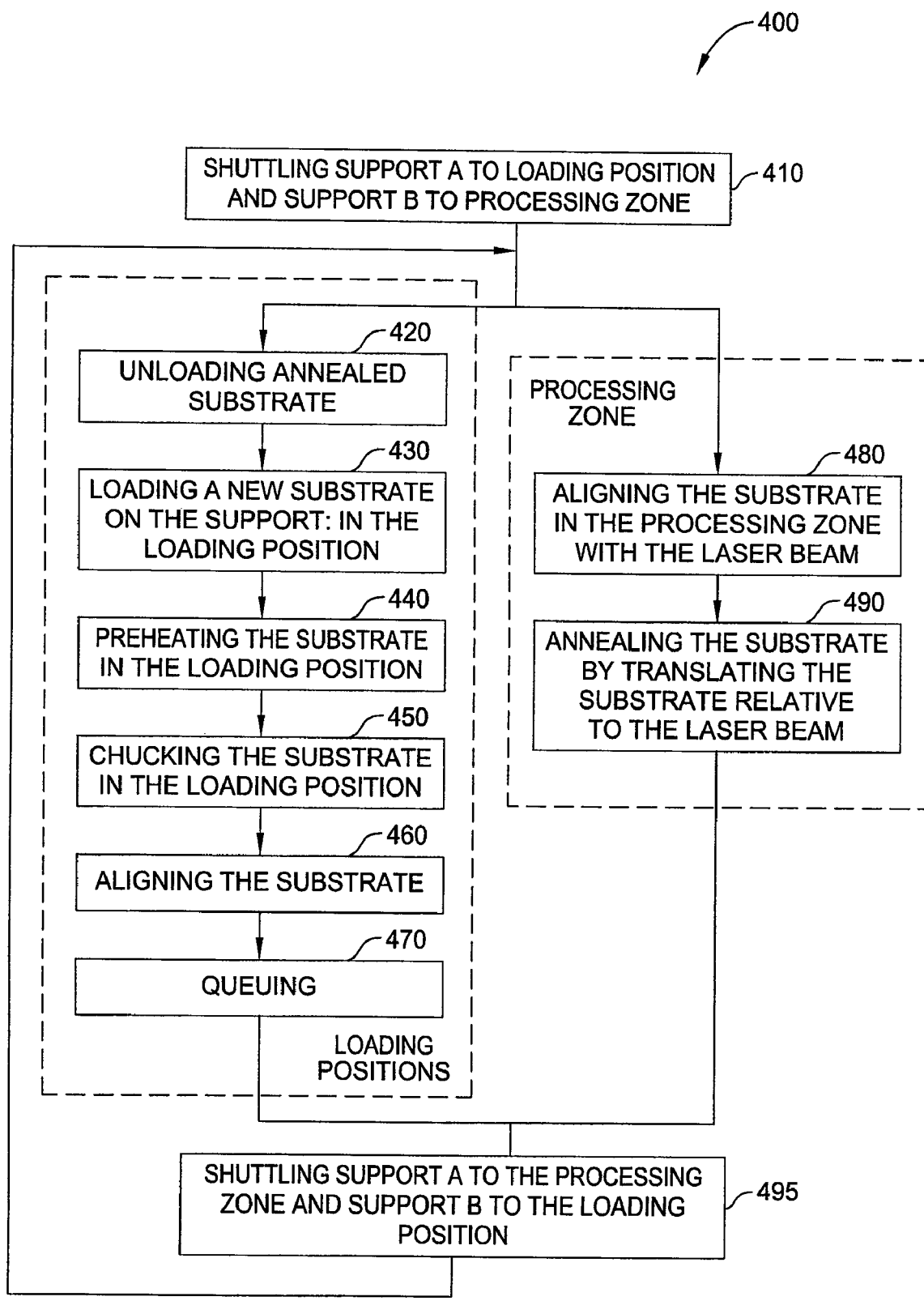
FIG. 6 illustrates a flow chart of a pulsed annealing process in accordance with one embodiment of the present invention.

FIG. 6 illustrates a flow chart of a pulsed anneal process 400 in accordance with one embodiment of the present invention. The pulsed anneal process 400 may be performed in a system comprising one energy source positioned in a processing zone and configured to process substrates supported by substrate support A or substrate support B. Each of the substrate supports A and B is movable between a loading position and the processing zone. In one embodiment, the pulsed anneal process 400 may be performed in the anneal processing system 200 shown in FIG. 4A and substrate supports A and B are the substrate support assemblies 213, 214 that can be moved by used of the shuttle 215.

In step 410, the substrate support A is moved to a loading position while the substrate support B is moved to the processing zone.

Steps 420, 430, 440, 450, 460, 470 may be performed in the loading position while steps 480, 490 are performed in the processing zone.

In step 420, a previously processed substrate is removed from the substrate support A.

In step 430, a new substrate is loaded on the substrate support A.

In step 440, a preheat process may be performed to the new substrate. In one embodiment, the new substrate may be loosely disposed on the substrate support A so that thermal expansion of the substrate during heating does not induce stress within the substrate. The preheating process may be performed by a heated surface on which the substrate is disposed. In another embodiment, the preheating process may be performed by a heating assembly positioned in the loading position, such as a radiant heating assembly.

In step 450, the heated substrate may be chucked to the substrate support. Chucking may be achieved by any suitable techniques, such as vacuum chucking and/or electrostatic chucking.

In step 460, an optional alignment step may be performed. The alignment may be a rough alignment to position the substrate in a position that is at least nearly in line with the energy projection region in the processing zone. In one embodiment, the alignment may comprise rotating and/or translating the substrate. The alignment may be performed relative to a notch on the substrate or other alignment markers.

The substrate may wait or que in the loading position for the processing zone to be available as shown in step 470.

In step 495, the substrate support A containing a heated and pre-aligned substrate may be transferred to the processing zone and the substrate support B, previously in the processing zone, may be transferred to its loading position. In one embodiment, the substrate support A and substrate support B each has a loading position, such as in the anneal processing system 200 of FIG. 4A. In another embodiment, the substrate supports A, B share one common loading position.

After being transferred to the processing zone, the substrate positioned on the substrate support A may be aligned with the energy projection region of the energy source, as shown in step 480. In one embodiment, the alignment comprises position a die on the substrate to the energy projection region. The alignment may be performed by rotation of the substrate and precise translation of the substrate using the substrate support.

After alignment, an anneal process may be performed as shown in step 490. The anneal process may be achieved using the energy source to expose a pulsed energy to the substrate region by region, or die by die. In one embodiment, the substrate may be moved relatively to the anneal region of the energy source continuously, and while pulses of energy projected to the substrate while a new region is moved within the alignment of the anneal region.

While the foregoing is directed to embodiments of the present invention, other and further embodiments of the invention may be devised without departing from the basic scope thereof, and the scope thereof is determined by the claims that follow.

What is claimed is:

1. A semiconductor processing chamber, comprising:
a chamber body forming a processing zone connected to a first loading zone and a second loading zone;
first and second doors to selectively isolate the processing zone from the first and second loading zones respectively;
a first substrate support configured to support a substrate;
a second substrate support configured to support a substrate;
a shuttle coupled to the first substrate support and the second substrate support, wherein the shuttle is configured to move the first substrate support between the processing zone and the first loading zone through the first door and to move the second substrate support between the processing zone and the second loading zone through the second door, and the processing zone has a processing volume configured to alternately accommodate the first substrate support and the second substrate support.

2. The apparatus of claim 1, wherein the shuttle has a first position and a second position, the first substrate support is in the first loading zone and the second substrate support is in the processing zone when the shuttle is in the first position, and the first substrate support is in the processing zone and the second substrate support is in the second loading zone when the shuttle is in the second position.

3. The apparatus of claim 2, wherein the shuttle moves linearly between the first position and the second position.

4. The apparatus of claim 1, wherein the shuttle moves the first and second substrate supports simultaneously.

5. The apparatus of claim 1, further comprising:
an energy source disposed in the processing zone, wherein the energy source is configured to project energy to an anneal region, and the first and second substrate supports are configured to align a desired portion of a substrate with the anneal region.

6. The apparatus of claim 5, wherein each of the first and second substrate supports comprises:
a substrate chuck configured to secure a substrate thereon;
a first stage configured to translate the substrate chuck along a first direction; and
a second stage configured to translate the substrate chuck along a second direction.

7. The apparatus of claim 6, wherein each of the first and second substrate supports further comprises a temperature control assembly configured to heat or cool a substrate positioned on the substrate chuck.

8. The apparatus of claim 5, wherein the energy source is configured to project pulsed laser energy.

9. The apparatus of claim 1, further comprising a load lock chamber positioned between the processing zone and the first and second loading zones.

10. A semiconductor processing chamber, comprising:
a first substrate support configured to support a substrate;
a second substrate support configured to support a substrate;
a shuttle coupled to the first substrate support and configured to move the first substrate support between a processing zone and a first loading zone, wherein the processing zone has a processing volume configured to alternately accommodating the first substrate support and the second substrate support; and
an energy source disposed in the processing zone, wherein the energy source is configured to project energy to an anneal region, the first and second substrate supports are configured to align a desired portion of a substrate with the anneal region,
wherein each of the first and second substrate supports comprises:
a substrate chuck configured to secure a substrate thereon;
a first stage configured to translate the substrate chuck along a first direction;
a second stage configured to translate the substrate chuck along a second direction; and
a rotating mechanism configured to rotate the substrate chuck about a central axis of the substrate chuck.

11. An annealing system, comprising:
a processing chamber having a processing zone, a first loading zone and a second loading zone;
doors to selectively insulate the processing zone from the first and second loading zones:
a first substrate support assembly configured to support and transfer a substrate between the first loading zone and the processing zone;

a second substrate assembly configured to support and transfer a substrate between the second loading zone and the processing zone;

a shuttle configured to alternately position the first and second substrate assemblies in the processing zone; and an energy source configured to project an energy to an anneal region in the processing zone.

12. The apparatus anneal system of claim 11, wherein the first loading zone and the second loading zone are positioned on opposite sides of the processing zone, the shuttle has a first position and a second position, the first substrate support assembly is in the first loading zone and the second substrate support assembly is in the processing zone when the shuttle is in the first position, and the first substrate support assembly is in the processing zone and the second substrate support assembly is in the second loading zone when the shuttle is in the second position.

13. The anneal system of claim 11, wherein each of the first and second substrate support assemblies comprises:

a substrate chuck configured to secure a substrate thereon;

a first stage configured to translate the substrate chuck along a first direction; and a second stage configured to translate the substrate chuck along a second direction.

14. The anneal system of claim 13, wherein each of the first and second substrate support assemblies further comprises a temperature control assembly configured to heat or cool a substrate positioned on the substrate chuck.

15. An annealing system, comprising:

a processing chamber having a processing zone, a first loading zone and a second loading zone;

a first substrate support assembly configured to support and transfer a substrate between the first loading zone and the processing zone;

a second substrate assembly configured to support and transfer a substrate between the second loading zone and the processing zone;

a shuttle configured to alternately position the first and second substrate assemblies in the processing zone; and an energy source configured to project an energy to an anneal region in the processing zone, wherein each of the first and second substrate support assemblies further comprises:

a substrate chuck configured to secure a substrate thereon;

a first stage configured to translate the substrate chuck along a first direction;

a second stage configured to translate the substrate chuck along a second direction; and a rotating mechanism configured to rotate the substrate chuck about a central axis of the substrate chuck.

16. A method for processing semiconductor substrates, comprising:

loading a first substrate on a first substrate support assembly positioned in a first loading zone;

preheating the first substrate in the first loading zone;

moving the first substrate support assembly through a first door to a processing zone to position the first substrate in the processing zone and moving a second substrate support assembly positioned in the processing zone through a second door to a second loading zone;

aligning a first region of the first substrate with an annealing region of an energy source disposed in the processing zone;

fluidly insulating the processing zone from the first and second loading zones by closing and sealing the first and second doors between the processing zone and the first and second loading zones; and projecting a pulsed energy to the first region of the first substrate using the energy source.

17. The method of claim 16, further comprising:

aligning a second region of the first substrate with the annealing region of the energy source; and projecting a pulsed energy to the second region of the first substrate using the energy source.

18. The method of claim 16, further comprising:

loading a second substrate on the second substrate support assembly positioned in the second loading zone and preheating the second substrate while aligning the first substrate with the energy source and projection a pulsed energy to the first substrate.

19. The method of claim 18, further comprising:

moving the first substrate from the processing zone to the first loading zone through the first door by moving the first substrate support assembly from the processing zone to the first loading zone, simultaneously positioning the second substrate in the processing zone by moving the second substrate support assembly through the second door to the processing zone.

20. The method of claim 19, wherein moving the first and second substrate assemblies is performed by a shuttle.

21. The method of claim 16, wherein aligning the first region of the first substrate with the anneal region comprising:

translating the first substrate along a first direction using a first stage positioned on the first substrate support assembly; and translating the first substrate along a second direction using a second stage positioned in the first substrate support assembly.

22. The method of claim 16, further comprising chucking the first substrate on the first substrate assembly after preheating the first substrate in the first loading zone.

23. The method of claim 16, further comprising unloading the first substrate from the first substrate support assembly in the first loading zone.

* * * * *

UNITED STATES PATENT AND TRADEMARK OFFICE
CERTIFICATE OF CORRECTION

PATENT NO. : 7,923,660 B2
APPLICATION NO. : 11/839436
DATED : April 12, 2011
INVENTOR(S) : Lerner et al.

Page 1 of 1

It is certified that error appears in the above-identified patent and that said Letters Patent is hereby corrected as shown below:

In the Claims:

Column 15, Claim 12, Line 8, please delete "apparatus".

Signed and Sealed this
Fifth Day of July, 2011

David J. Kappos
*Director of the United States Patent and Trademark Office*